United States Patent
Xiao

(10) Patent No.: US 9,853,026 B2
(45) Date of Patent: Dec. 26, 2017

(54) FINFET DEVICE AND FABRICATION METHOD THEREOF

(71) Applicant: Semiconductor Manufacturing International (Shanghai) Corporation, Shanghai (CN)

(72) Inventor: De Yuan Xiao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/280,217

(22) Filed: May 16, 2014

(65) Prior Publication Data
US 2014/0353715 A1 Dec. 4, 2014

(30) Foreign Application Priority Data
Jun. 4, 2013 (CN) .......................... 2013 1 0218019

(51) Int. Cl.
*H01L 29/66* (2006.01)
*H01L 27/088* (2006.01)
*H01L 21/8234* (2006.01)
*H01L 21/8258* (2006.01)
*H01L 27/06* (2006.01)

(52) U.S. Cl.
CPC ...... *H01L 27/0886* (2013.01); *H01L 21/8258* (2013.01); *H01L 21/823431* (2013.01); *H01L 27/0605* (2013.01)

(58) Field of Classification Search
CPC ............. H01L 27/0886; H01L 27/0605; H01L 21/8258; H01L 21/823431
See application file for complete search history.

(56) References Cited

U.S. PATENT DOCUMENTS

| | | | |
|---|---|---|---|
| 2002/0011612 A1* | 1/2002 | Hieda | H01L 21/823814 257/262 |
| 2006/0040452 A1* | 2/2006 | Lotfi | H01L 21/823814 438/305 |
| 2008/0169484 A1* | 7/2008 | Chuang et al. | 257/190 |

(Continued)

FOREIGN PATENT DOCUMENTS

| | | |
|---|---|---|
| CN | 101226958 | 7/2008 |
| WO | 2011/087570 A1 | 7/2011 |

OTHER PUBLICATIONS

M. Radosavljevic et al.,"Non-Planar, Multi-Gate InGaAs Quantum Well Field Effect Transistors with High-K Gate Dielectric and Ultra-Scaled Gate-to-Drain/Gate-to-Source Separation for Low Power Logic Applications", IEDM 2010, pp. 126-129.

*Primary Examiner* — Su C Kim
(74) *Attorney, Agent, or Firm* — Innovation Counsel LLP

(57) ABSTRACT

A transistor device may include a substrate that has a well portion. The transistor device may further include a source member and a drain member. The transistor device may further include a fin bar. The fin bar may be formed of a first semiconductor material, may be disposed between the source member and the drain member, and may overlap the well portion. The transistor device may further include a fin layer. The fin layer may be formed of a second semiconductor material, may be disposed between the source member and the drain member, and may contact the fin bar.

20 Claims, 6 Drawing Sheets

(56) References Cited

U.S. PATENT DOCUMENTS

| | | | |
|---|---|---|---|
| 2010/0252816 A1* | 10/2010 | Ko | H01L 29/66818 257/24 |
| 2010/0252862 A1* | 10/2010 | Ko | H01L 29/1054 257/192 |
| 2013/0056795 A1* | 3/2013 | Wu et al. | 257/191 |
| 2013/0224936 A1* | 8/2013 | Lee | H01L 21/823821 438/492 |
| 2014/0103429 A1* | 4/2014 | Chuang | H01L 29/66681 257/335 |
| 2014/0252469 A1* | 9/2014 | Lee | H01L 29/66431 257/337 |

\* cited by examiner

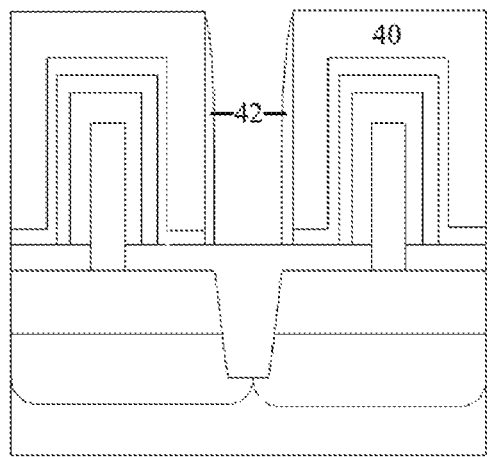
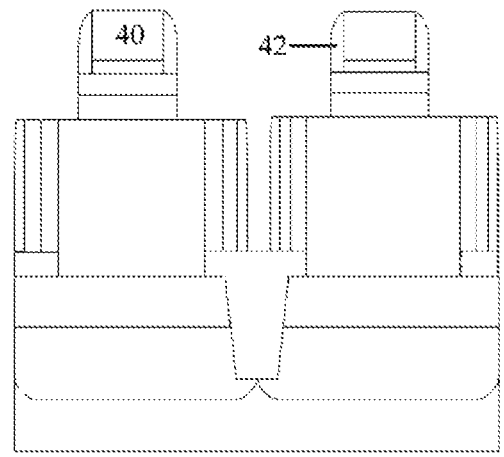
Fig. 10A　　　　　　　　Fig. 10B
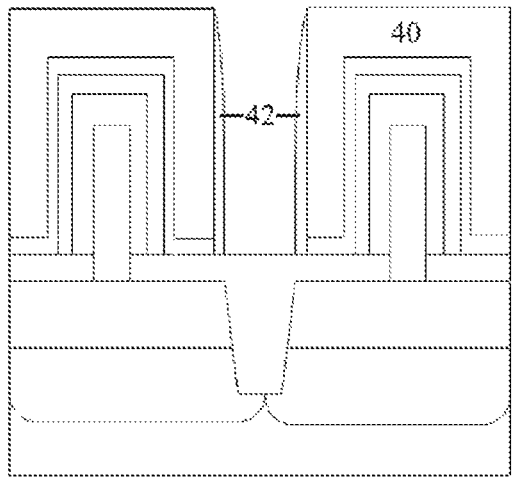
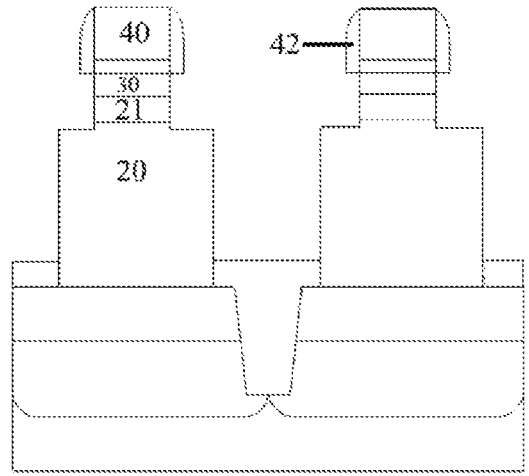
Fig. 11A　　　　　　　　Fig. 11B
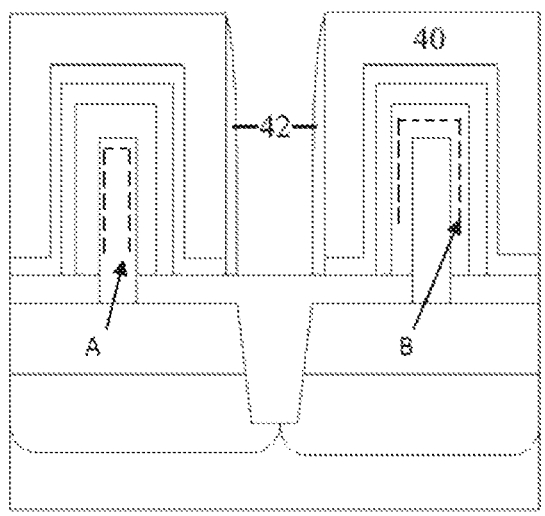
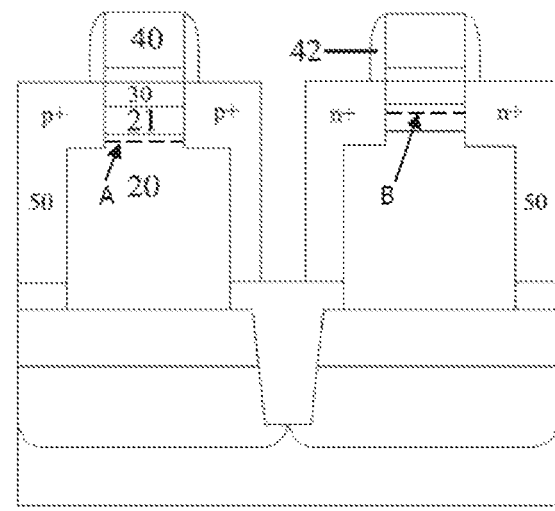
Fig. 12A　　　　　　　　Fig. 12B

US 9,853,026 B2

FINFET DEVICE AND FABRICATION METHOD THEREOF

CROSS-REFERENCE TO RELATED APPLICATIONS

This application claims priority to and benefit of Chinese Patent Application No. 201310218019.9, filed on Jun. 4, 2013 and entitled "HIGH MOBILITY FINFET AND FABRICATION METHOD THEREOF", which is incorporated herein by reference in its entirety.

FIELD OF THE INVENTION

The present invention is related to a FinFET (Fin Field-Effect Transistor) and a method for fabricating the FinFET.

DESCRIPTION OF THE RELATED ART

Size reduction may enable performance improvement for metal oxide semiconductor field effect transistor (MOSFET) devices. For example, in a MOSFET device, reduction in channel lengths of field effect transistors (FETs) may increase operation speeds of the FETs. Nevertheless, if a channel length is reduced to about the same order of magnitude as a depletion layer width of the corresponding source and drain junction, undesirable short-channel effects may arise. Typically, a substantially complicated FET device structure associated with a substantially complicated fabrication process may be required for mitigate the short-channel effects.

SUMMARY OF THE INVENTION

Embodiments of this invention may be related to a QW-FinFET device that includes an n-type field effect transistor and a p-type field effect transistor and has a structure that may be substantially less complicated in comparison with structures of conventional FinFETs. Embodiments of this invention may be related to a method for fabricating the QW-FinFET.

An embodiment of this invention may be related to a transistor device that may include a substrate. The substrate may have a first-type well portion (e.g., an n-well portion). The transistor device may further include a first source member and a first drain member. The transistor device may further include a first fin bar. The first fin bar may be formed of a first semiconductor material, may be disposed between the first source member and the first drain member, and may overlap the first-type well portion. The transistor device may further include a first fin layer. The first fin layer may be formed of a second semiconductor material, may be disposed between the first source member and the first drain member, and may contact the first fin bar.

In an embodiment of this invention, the transistor device may include the following elements: a second source member; a second drain member; a second fin bar formed of the first semiconductor material, disposed between the second source member and the second drain member, and overlapping a second-type well portion (e.g., a p-well portion) of the substrate; and a second fin layer formed of the second semiconductor material, disposed between the second source member and the second drain member, and contacting the second fin bar.

In an embodiment of this invention, the first fin layer directly contacts three side surfaces of the first fin bar.

In an embodiment of this invention, a bandgap of the first semiconductor material is narrower than a bandgap of the second semiconductor material.

In an embodiment of this invention, the first semiconductor material is a p-type semiconductor material, and the second semiconductor material is an n-type material.

In an embodiment of this invention, the transistor device may include a first barrier layer. The first barrier layer may be formed of a third semiconductor material and may contact the first fin layer.

In an embodiment of this invention, a bangap of the third semiconductor material is broader than a bandgap of the second semiconductor material.

In an embodiment of this invention, the third semiconductor material is an n-type material.

In an embodiment of this invention, the transistor device may include a first gate. The first gate may overlap a first portion of the first fin bar without overlapping a second portion of the first fin bar in a direction perpendicular to a surface (e.g., bottom surface) of the substrate. A thickness of the first portion of the first fin bar in the direction is unequal to (e.g., is greater than) a thickness of the second portion of the first fin bar in the direction.

In an embodiment of this invention, the transistor device may include a buffer layer disposed between the first fin bar and the substrate. The buffer layer may be formed by SiGe, GaAs, or AlGaAs. The semiconductor substrate may include a Si(111) portion.

An embodiment of this invention may be related to a method for fabricating a transistor device. The method may include the following steps: forming a first fin bar using a first semiconductor material such that the first fin bar overlaps a first-type well portion of a substrate; forming a first fin layer using a second semiconductor material such that the first fin layer contacts the first fin bar; forming a first source member such that the first source member contacts a first side of the first fin bar and a first side of the first fin layer; and forming a first drain member such that the first drain member contacts a second side of the first fin bar and a second side of the first fin layer.

In an embodiment of this invention, the method may include the following steps: forming a second fin bar using the first semiconductor material such that the second fin bar overlaps a second-type well portion of a substrate, wherein the first fin bar and the second fin bar are formed substantially simultaneously; forming a second fin layer using a second semiconductor material such that the second fin layer contacts the second fin bar, wherein the first fin layer and the second fin layer are formed substantially simultaneously; forming a second source member such that the second source member contacts a first side of the second fin bar and a first side of the second fin layer; and forming a second drain member such that the second drain member contacts a second side of the second fin bar and a second side of the second fin layer.

In an embodiment of this invention, a bandgap of the first semiconductor material is narrower than a bandgap of the second semiconductor material, the first semiconductor material is a p-type semiconductor material, and the second semiconductor material is an n-type material.

In an embodiment of this invention, the step of forming the first source member may include the following steps: performing etching to expose an exposed portion of the first side of the first fin bar and an exposed portion of the first side of the first fin layer; and growing the first source member to contact the exposed portion of the first side of the first fin bar and the exposed portion of the first side of the first fin layer.

In an embodiment of this invention, the method may include the following steps: forming a first gate that overlaps a first semiconductor material layer and a second semiconductor material layer; using the first gate as a mask in performing directional etching on the first semiconductor material layer and the second semiconductor material layer to form a first semiconductor layer and a second semiconductor layer; and performing isotropic etching on the first semiconductor layer and the second semiconductor layer for forming the first fin bar and the first fin layer.

In an embodiment of this invention, the method may include the following step: forming a sidewall spacer that contacts a side of the gate. The isotropic etching may remove a portion of the first semiconductor layer that is positioned between the sidewall spacer and the substrate.

In an embodiment of this invention, the first source member and the first drain member are formed of InGaAs.

In an embodiment of this invention, the method may include the following step: forming a first barrier layer using a third semiconductor material such that the first barrier layer contacts the first fin layer. A bangap of the third semiconductor material may be broader than a bandgap of the second semiconductor material.

In an embodiment of this invention, the first barrier layer is or includes an n-type InP layer.

In an embodiment of this invention, the method may include the following step: forming a buffer layer on the substrate. The first fin bar may be formed on the buffer layer. The buffer layer may be formed of SiGe, GaAs, or AlGaAs. The substrate may include a Si(111) portion and/or may be a Si(111) substrate.

An embodiment of this invention may be related to a FinFET that may include the following elements and/or features: a substrate; a fin body provided on the substrate, the fin body comprising: a first-semiconductor fin bar of a first conductivity type, and a second-semiconductor fin layer of a second conductivity type different to the first conductivity type, which covers the first-semiconductor fin bar conformably; a gate covering the fin body, wherein the gate and the fin body are separated from each other by a gate insulating layer; and a source and a drain provided on two opposite sides of the gate, respectively, and contacting both the first-semiconductor fin bar and the second-semiconductor fin layer.

In an embodiment of this invention, the bandgap of the second-semiconductor fin layer is larger than the bandgap of the first-semiconductor fin bar.

In an embodiment of this invention, the first-semiconductor fin bar is a Ge quantum well layer, and the first conductivity type is p type.

In an embodiment of this invention, the second-semiconductor fin layer is an InGeAs quantum well layer, and the second conductivity type is n type.

In an embodiment of this invention, the fin body further comprises a barrier layer, which covers the second semiconductor fin layer conformably.

In an embodiment of this invention, the bandgap of the barrier layer is larger than the bandgap of the second-semiconductor fin layer.

In an embodiment of this invention, the barrier layer is an n-type InP layer.

In an embodiment of this invention, the second-semiconductor fin layer is located directly below the gate. A step is formed between a portion of the first semiconductor fin bar that is located directly below (and overlaps) the gate and a portion of the first semiconductor fin bar that is not covered by the gate.

In an embodiment of this invention, the FinFET may include a buffer layer provided between the substrate and the fin body. The buffer layer may be formed of SiGe, GaAs, or AlGaAs. The substrate semiconductor may be a Si(111) substrate.

In an embodiment of this invention, the source and the drain are mainly formed of InGaAs.

An embodiment of this invention may be related to a method for fabricating a FinFET. The method may include the following steps and/or features: forming a first-semiconductor fin bar of a first conductivity type on a substrate; forming a second-semiconductor fin layer of a second conductivity type different to the first conductivity type on the first-semiconductor fin bar, the second-semiconductor fin layer covering the first-semiconductor fin bar conformably; forming a gate insulating layer on the second-semiconductor fin layer; forming a gate on the gate insulating layer; and forming a source and a drain on two opposite sides of the gate, respectively, wherein each of the source and the drain is formed to contact both the first-semiconductor fin bar and the second-semiconductor fin layer.

In an embodiment of this invention, the bandgap of the second-semiconductor fin layer is larger than the bandgap of the first-semiconductor fin bar.

In an embodiment of this invention, the first-semiconductor fin bar is a Ge quantum well layer, and the first conductivity type is p type; the second-semiconductor fin layer is an InGeAs quantum well layer, and the second conductivity type is n type.

In an embodiment of this invention, the step of forming the source and the drain comprises the following steps: etching to expose a portion of (a material layer configured for forming) the first-semiconductor fin bar and side walls of (a material layer configured for forming) the second-semiconductor fin layer; and growing the source and the drain to contact the exposed portion of the first-semiconductor fin bar and the exposed side walls of the second-semiconductor fin layer.

In an embodiment of this invention, the etching comprises the following steps: using the gate as a mask, performing directional etching to expose a portion of the top surface of the first-semiconductor fin bar; and performing isotropic etching to form undercut of the first-semiconductor fin bar and the second-semiconductor fin layer below the gate.

In an embodiment of this invention, the source and the drain are formed of InGaAs.

In an embodiment of this invention, the method comprises the following steps: before forming the gate insulating film, forming a barrier layer, which covers the second-semiconductor fin layer conformably. The band gap of the barrier layer may be larger than the band gap of the second-semiconductor fin layer. In an embodiment of this invention, the barrier layer is an n-type InP layer.

In an embodiment of this invention, the method comprises the following steps: forming a buffer layer on the substrate. The first-semiconductor fin bar may be grown on the buffer layer. The buffer layer may be formed of SiGe, GaAs, or AlGaAs. The substrate may be a Si(111) substrate.

BRIEF DESCRIPTION OF THE DRAWINGS

In the drawings, like reference numerals may refer to like structural elements, and structural elements may not be drawn to scale unless otherwise indicated.

FIG. 10A and FIG. 10B are cross-sectional views showing an intermediate structure in the process of forming the QW-FinFET according to an embodiment of this invention.

FIG. 11A and FIG. 11B are cross-sectional views showing an intermediate structure in the process of forming the QW-FinFET according to an embodiment of this invention.

FIG. 12A and FIG. 12B are cross-sectional views showing the QW-FinFET formed according to an embodiment of this invention.

FIG. 4A, FIG. 5A, FIG. 6A, FIG. 7A, FIG. 8A, FIG. 9A, FIG. 10A, FIG. 11A, and FIG. 12A are cross-sectional views that are taken along a direction perpendicular to the extension direction of a fin of the FinFET. FIG. 4B, FIG. 5B, FIG. 6B, FIG. 7B, FIG. 8B, FIG. 9B, FIG. 10B, FIG. 11B, and FIG. 12B are cross-sectional views that are taken along the extension direction of the fin of the FinFET.

DESCRIPTION OF THE EMBODIMENTS

In the following detailed description, details are set forth to provide a thorough understanding of the described embodiments. It will be apparent to one skilled in the art that the described embodiments can also be implemented without some or all of these specific details. In the described embodiments, well-known structures or process steps may not be described in detail, in order to avoid unnecessarily obscuring the concept of the present invention.

Figure 1:
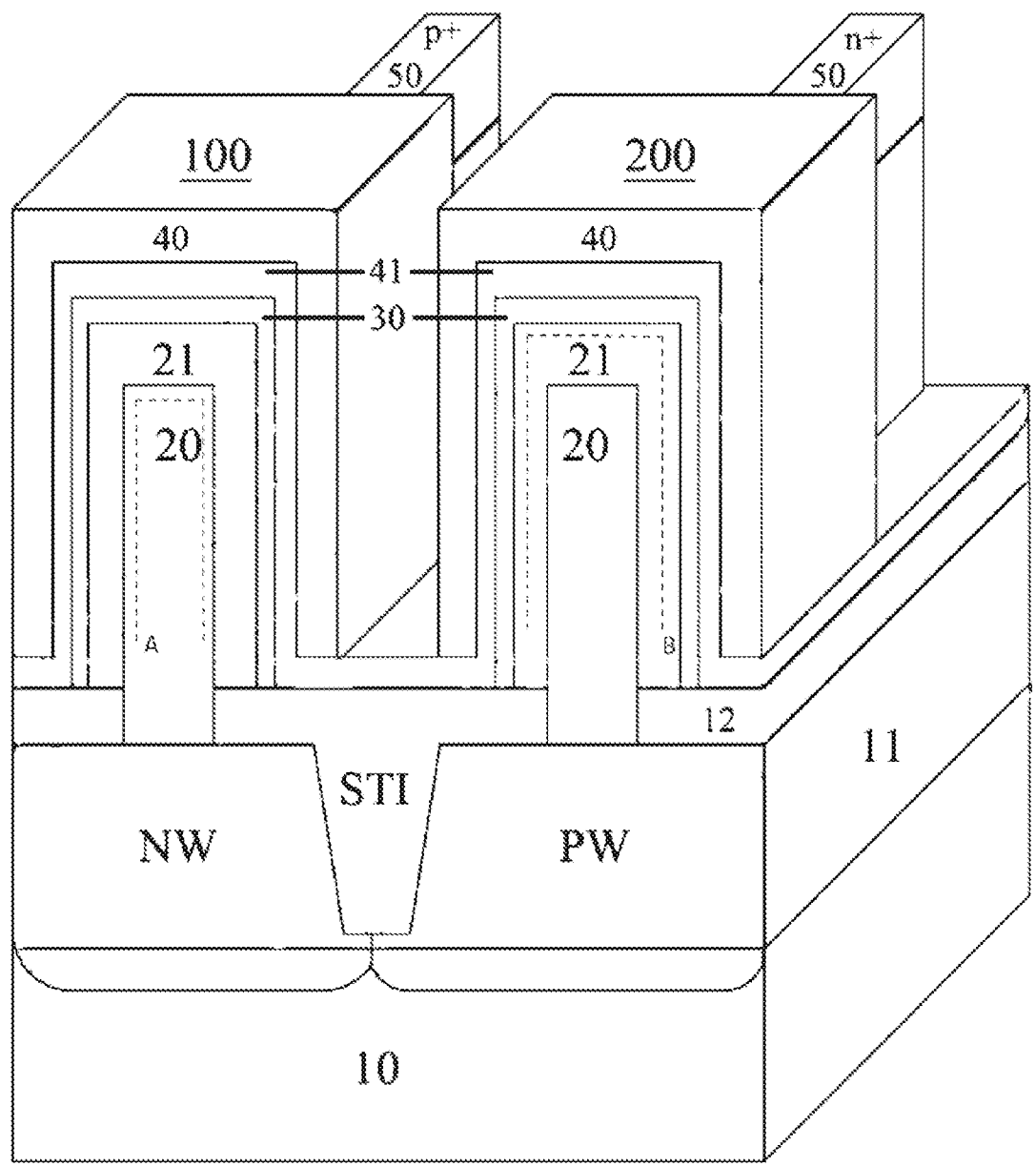
FIG. 1 is a perspective view illustrating a portion of a quantum well Fin-type field effect transistor (QW-FinFET) according to an embodiment of this invention.

FIG. 1 is a perspective view illustrating a portion of a quantum well Fin-type field effect transistor (QW-FinFET) device according to an embodiment of this invention, wherein another portion of the QW-FinFET is removed to clearly show the structure of the transistor device. FIG. 1 shows that a first-type (e.g., p-type) FET (field effect transistor) 100 and a second-type (e.g., n-type) FET 200, which are separated from each other by a Shallow Trench Isolation (STI) structure, are provided on a common substrate 10. In an embodiment, a plurality of first-type (e.g., p-type) FETs 100 and/or a plurality of second-type (e.g., n-type) FETs 200 may be formed on the substrate and may be separated from each other.

As shown in FIG. 1, a n well (NW) and a p well (PW) may be formed on the common substrate 10, the p-type FET 100 may be formed on the n well, and the n-type FET 200 may be formed on the p well. The substrate 10 may be a bulk Si substrate or a Si on Insulator (SOI) substrate. FIG. 1 illustrates that the substrate 10 may be an SOI substrate. In an embodiment, the substrate 10 may be a Si (111) substrate.

In an embodiment, as illustrated in FIG. 1, a buffer layer 11 may be formed on the surface of the substrate 10 to relieve lattice mismatch between a substrate and a semiconductor layer to be formed thereon, and/or to apply a tensile stress or a pressure stress to the semiconductor layer to be formed. The material of the buffer layer 11 may be selected depending on the semiconductor layer to be formed. In an embodiment of this invention, the buffer layer 11 may be formed of SiGe, GaAs, or AlGaAs. The n well and the p well may extend into the substrate 10 from the buffer layer 11.

Fin bars 20 are formed on the n well and the p well. A portion of the substrate 10 (and/or the buffer layer 11) that is not covered by the fin bars 20 may be covered by an insulating protection layer 12, which may be formed of an inorganic insulating material, such as $SiO_2$. In an embodiment, the STI structure between the n well and the p well may also be formed of $SiO_2$.

Each fin bar 20 may be covered by a fin layer 21. The fin layer 21 may be formed on the fin bars 20 conformably and may cover three side surfaces of the fin bar 20. The fin bar 20 may function as a first quantum well layer, the fin layer 21 may function as a second quantum well layer, and the fin bar 20 and the fin layer 21 may constitute a fin of the QW-FinFET in an embodiment. In an embodiment of this invention, the fin bars 20 may be formed of a first narrow bandgap semiconductor material, and the fin layer 21 may be formed of a second narrow bandgap semiconductor material, wherein the bandgap of the first narrow bandgap semiconductor material is narrower than the bandgap of the second narrow bandgap semiconductor material. In an embodiment of this invention, a fin bar 20 may be formed of Ge. In an embodiment, a fin bar 20 may be or may include a Ge layer doped with P-type impurities, e.g., a Ge layer shallowly doped with P-type impurities. In an embodiment, the doping concentration may be in a range from $1\times10^{16}$ to $1\times10^{17}$ $cm^{-3}$. In an embodiment, a fin bar 20 may be or may include an undoped Ge layer. Note that in embodiments of this invention, both Ge doped with P-type impurities and undoped Ge may be referred to as p-type Ge, since undoped Ge can also conduct hole carriers due to special energy band structure of heterojunction, and hence can be considered as p-type Ge. The fin layer 21 may be or may include an n-type InGaAs layer, such as $In_{0.25}Ga_{0.75}As$.

A barrier layer 30 may be formed conformably on each fin layer 21. The barrier layer 30 may limit conduction of two-dimensional electron gas in a third dimension perpendicular to the two dimensions. In an embodiment of this invention, the barrier layer 30 may be formed of a broad bandgap semiconductor material. In an embodiment, the barrier layer 30 may be or may include an n-type InP layer.

Each barrier layer 30 may be covered conformably by a gate 40, and a gate insulating layer 41 is located between the barrier layer 30 and the gate 40. The gate insulating layer 41 may be formed of a high-k dielectric material, such as $TiSiO_x$, $Al_2O_3$, or an alternative material. The gates 40 may be formed of a metal material, such as NiAu, TiAu, or an alternative material.

A source and a drain 50 may be formed on opposite sides of each gate 40 and may contact both a fin bar 20 and a fin layer 21. For the p-type FET 100, the source and the drain 50 may be formed of a p+ type semiconductor material, such as p+ type InGaAs; For the n-type FET 200, the source and the drain 50 may be formed of a n+ type semiconductor material, such as n+ type InGaAs. It should be understood that one of the source and the drain is removed in FIG. 1 to show the layers of the structure.

Figure 2A:
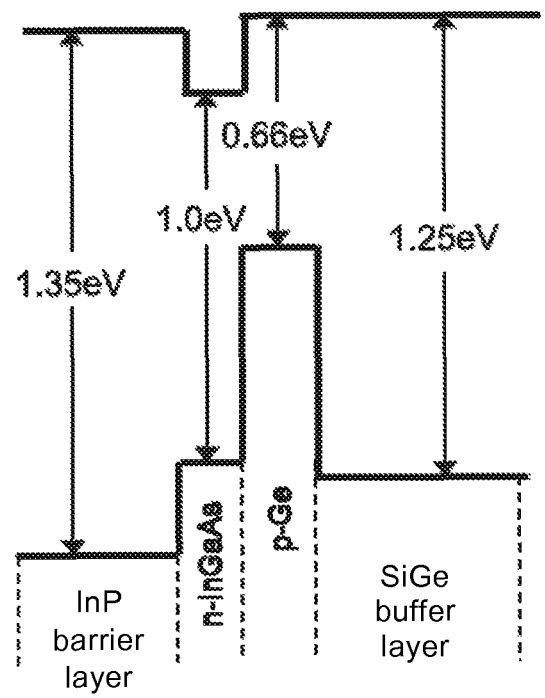
FIG. 2A, FIG. 2B and FIG. 2C are energy band views showing energy bands of the QW-FinFET under different conditions according to an embodiment of this invention.
Figure 2B:
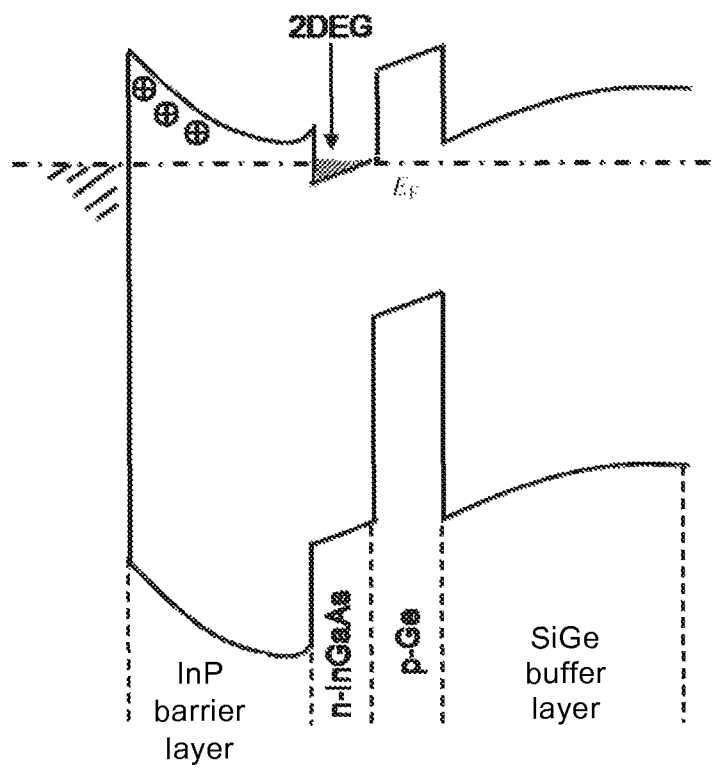
Figure 2C:
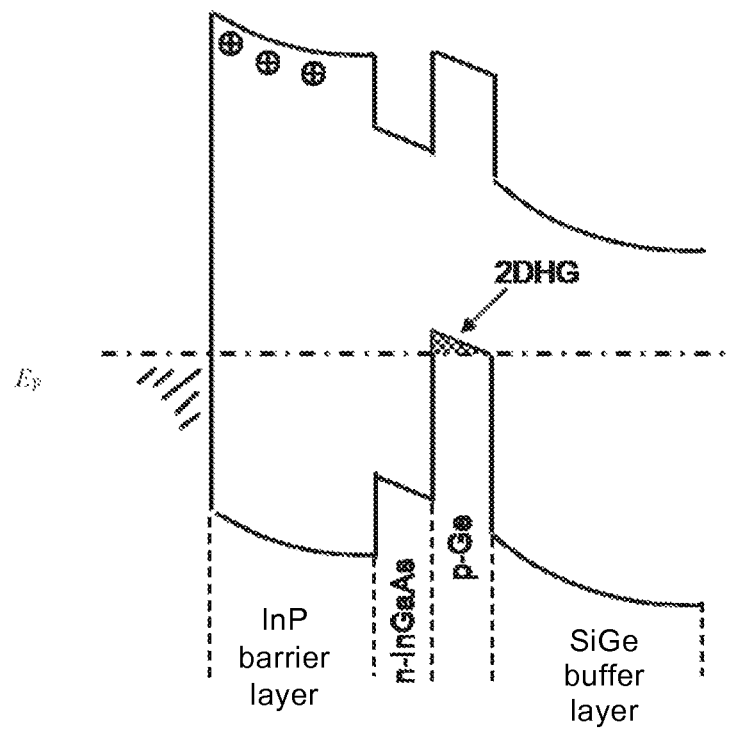

FIG. 2A, FIG. 2B and FIG. 2C are energy band views showing energy bands of the QW-FinFET according to an embodiment of this invention under different conditions. Particularly, FIG. 2A shows the flat band, FIG. 2B shows the energy band of the n-type FET 200 at a positive gate bias, and FIG. 2C shows the energy band of the p-type FET 100 at a negative gate bias. Operations of the QW-FinFET according to an embodiment will be described with reference to FIG. 1, FIG. 2A, FIG. 2B and FIG. 2C.

Referring to the flat band diagram illustrated in FIG. 2A, the barrier layer 30 formed of a broad bandgap material, such as InP, has a broad bandgap, for example, 1.35 eV. The fin layer 21 formed of, for example, InGaAs has a narrow bandgap, for example, 1.0 eV. The fin bar 20 formed of, for example, Ge has a narrower bandgap, for example, 0.66 eV. The SiGe buffer layer 11 may have, for example, a 1.25 eV bandgap.

For the n-type FET 200, when a positive bias voltage is applied to its gate 40, an electron quantum well, i.e., a portion of the conduction band of InGaAs that is below the Fermi level $E_F$, is formed on the InGaAs side of the InP/InGaAs heterojunction. Electron carriers in the n-type InP barrier layer 30 may enter into the quantum well on the InGaAs side, may form a two-dimensional electron gas (2DEG), and may perform electric conduction, as shown by dashed line B in FIG. 1. The InP layer 30 may be depleted. The thickness and doping concentration of the InP layer may be important for controlling the two-dimensional electron gas. When a negative bias voltage is applied to the gate 40, the n-type FET 200 is turned off.

On the other hand, for the p-type FET 100, when a negative bias voltage is applied to its gate 40, a hole quantum well, i.e., a portion of the valence band of Ge that is above the Fermi level $E_F$ (valence band top), is formed on the Ge side of the InGaAs/Ge heterojunction. Hole carriers in the p-type Ge fin bar 20 may enter into the quantum well, may form a two-dimensional hole gas (2DHG), and may perform electric conduction, as shown by dashed line A in FIG. 1. When a positive bias voltage is applied to the gate 40, the p-type FET 100 is turned off.

As can be appreciated from the above description given in conjunction with FIGS. 1, 2A, 2B, and 2C, the p-type FET and the n-type FET may have the same synthetic channel structure constituted by a barrier layer 30, a fin layer 21, and a fin bar 20. In an embodiment, p-type FET may differ from the n-type FET only in the conduction type of the source and the drain. In the prior art, it is typically necessary to form substantially different p-type and n-type channels for p-type and n-type FETs. Advantageously, in comparison with the prior art, embodiments of this invention may significantly simplify the fabrication process.

As can be appreciated from the above description, the structure that includes the fin bars 20 formed of Ge, the fin layers 21 formed of InGaAs, and the barrier layer 30 formed of InP may provide desirable effects by taking advantage of its energy band structure. The materials are discussed as illustrative examples. According to embodiments of this invention, other semiconductor materials having appropriate energy bands may be utilized.

FIG. 3 to FIG. 12B are a series of cross-sectional views showing a process of fabricating a QW-FinFET according to an embodiment of this invention. It should be understood that although FIG. 3 to FIG. 12B show that a p-type and an n-type QW-FinFETs are substantially simultaneously formed on a substrate, this invention is not limited thereto. In an embodiment, a p-type QW-FinFET and an n-type QW-FinFET may be separately formed and/or individually formed.

Although steps of an illustrative process will be described in an illustrative sequence from FIG. 3 to FIG. 12B, those skilled in the art would understand that embodiments of the invention are not limited to this sequence. In some embodiments, some steps may be performed concurrently, and/or some steps may be performed in a sequence different from the illustrative sequence. In some embodiments, some steps may be omitted, or additional steps may be added.

Figure 3:
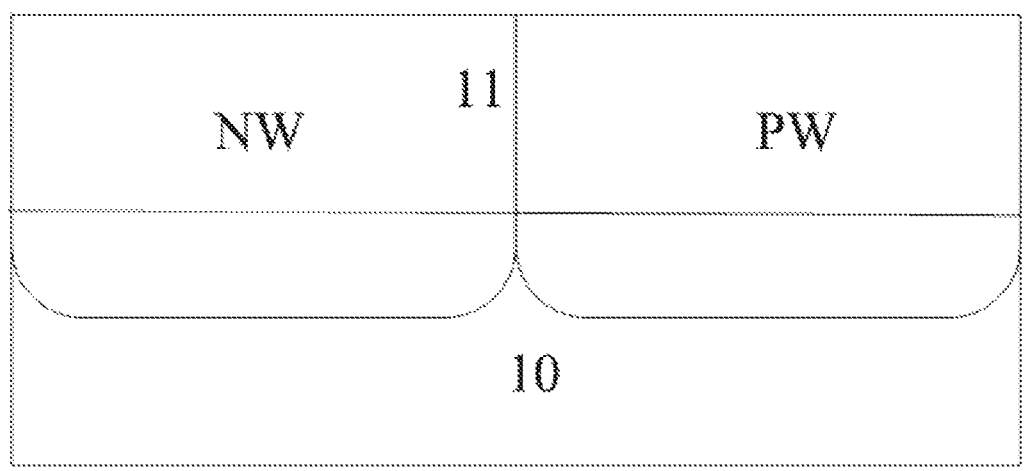
FIG. 3 is a cross-sectional view showing an intermediate structure in a process of forming a QW-FinFET according to an embodiment of this invention.

Referring to FIG. 3, a substrate 10 is provided. The substrate 10 may be, for example, a bulk Si substrate or a Si on Insulator (SOI) substrate. FIG. 3 illustrates that the substrate 10 is an SOI substrate. In an embodiment, the substrate 10 may be a Si(111) substrate.

In an embodiment of this invention, a buffer layer 11 is formed on the substrate 10. For example, a SiGe, GaAs, or AlGaAs buffer layer 11 may be epitaxial grown on a Si(111) substrate through Metal-organic Chemical Vapor Deposition (MOCVD), Molecular beam epitaxy (MBE), atomic layer deposition (ALD), or an alternative process. The buffer layer 11 may have a thickness in a range of about 10 to 500 nm.

In an embodiment of this invention, a p well and an n well may be formed on the substrate 10. For example, a p well and an n well may be formed through implanting $As^+$ ions and $B^+$ ions, respectively. Other ion implanted impurities known by those skilled in the art may be used in some embodiments.

Figures 4A, 4B:
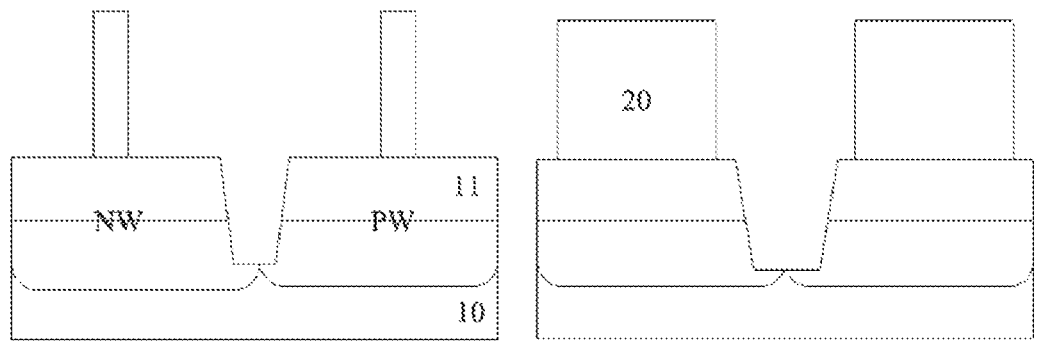
FIG. 4A and FIG. 4B are cross-sectional views showing an intermediate structure in the process of forming the QW-FinFET according to the embodiment of this invention.

FIG. 4A and FIG. 4B are cross-sectional views showing formation of fin bars 20 on the n well and the p well, respectively. FIG. 4A is a cross-sectional view that is taken along a direction perpendicular to the extension direction of the fin bars 20 (or the channel direction). FIG. 4B is a cross-sectional view that is taken along the extension direction of the fin bars 20.

The fin bars 20 may be formed through epitaxial growing a p-type Ge layer on the buffer layer 11 by MOCVD, MBE, ALD, or an alternative process, and then performing photoetching or etching on the p-type Ge layer. The p-type Ge layer may be epitaxial grown to a thickness in a range of about 10 to 200 nm. When (and/or after) the p-type Ge layer is etched, a trench of a STI structure may be formed in the substrate 10 between the p well and the n well.

Figures 5A, 5B:
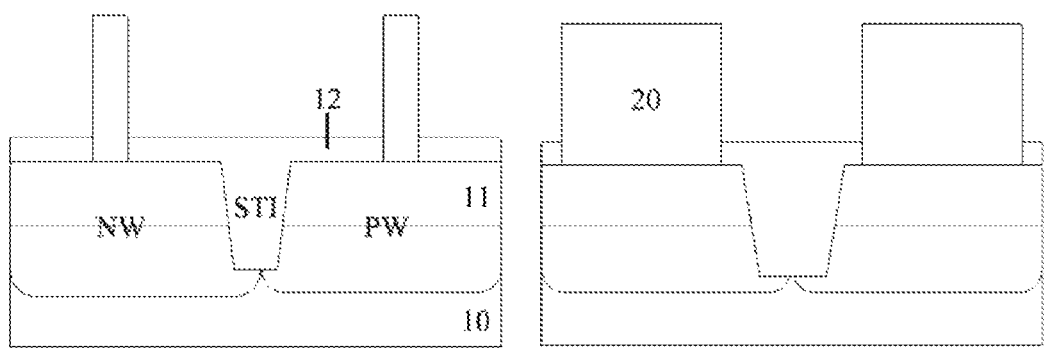
FIG. 5A and FIG. 5B are cross-sectional views showing an intermediate structure in the process of forming the QW-FinFET according to an embodiment of this invention.

Subsequently, as shown in FIG. 5A and FIG. 5B, an insulating protection layer 12 may be formed to cover a portion of the substrate 10 (and/or the buffer layer 11) that is not covered by the fin bars 20 and to form a STI structure. Both the protection layer 12 and the STI structure may be formed of the same material, such as $SiO_2$. In an embodiment, $SiO_2$ may be deposited through Physical Vapor Deposition (PVD) or Chemical Vapor Deposition (CVD) to cover the surface of the structure shown in FIG. 4A and FIG. 4B and to fill the trench, and then planarization may be performed through Chemical-Mechanical Planarization (CMP) until the top surface of the fin bars 20 is exposed. Subsequently, etchback may be performed until the protection layer 12 on the substrate 10 (or the buffer layer 11) has an appropriate thickness.

Figures 6A, 6B:
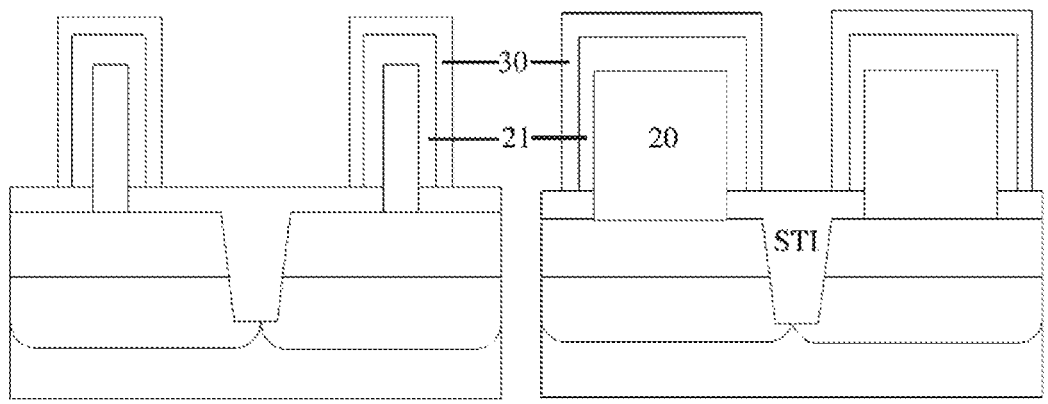
FIG. 6A and FIG. 6B are cross-sectional views showing an intermediate structure in the process of forming the QW-FinFET according to an embodiment of this invention.

Referring to FIG. 6A and FIG. 6B, a fin layer 21 and a barrier layer 30 are formed on each of the fin bars 20. The fin layer 21 may be an n-type InGaAs quantum well layer formed mainly of a semiconductor material, such as InGaAs, through MOCVD, MBE, or an alternative process, and may have a thickness in a range of about 10 to 100 nm. The barrier layer 30 may also be formed through MOCVD, MBE, or an alternative process. The barrier layer 30 may be formed of, for example, InP and may comprise n-type impurities, for example, Si impurities in a range of $0.5 \times 10^{18}$ $cm^{-3}$ to $10 \times 10^{18}$ $cm^{-3}$. In an embodiment, the Si impurities of the barrier layer 30 may be $1.2 \times 10^{18}$ $cm^{-3}$, and the thickness of the barrier layer 30 may be in a range of about 50 to 100 nm. Through the epitaxial growing process, three sides of each fin bar 20 may be properly covered by a fin layer 21 and a barrier layer 30.

According to embodiments of the invention, same formation steps, including same steps for forming the same synthetic channel structures that include layers 20, 21 and 30, are performed for p-channel and n-channel FETs. A continuous epitaxial growth of the fin layer 21 and the barrier 30 may be performed in a same vacuum device. In conventional techniques, it is typically necessary to form different channels for p-channel and n-channel FETs separately. The conventional techniques typically need additional masking, photoetching, etching, and/or one or more alternative or additional processes between the steps of forming a channel for a p-type FET and a channel for an n-type FET, and the vacuum state may be interrupted and restored. In comparison with the conventional techniques, embodiments of this invention may significantly simplify the fabrication process and improve productivity of FETs.

Figures 7A, 7B:
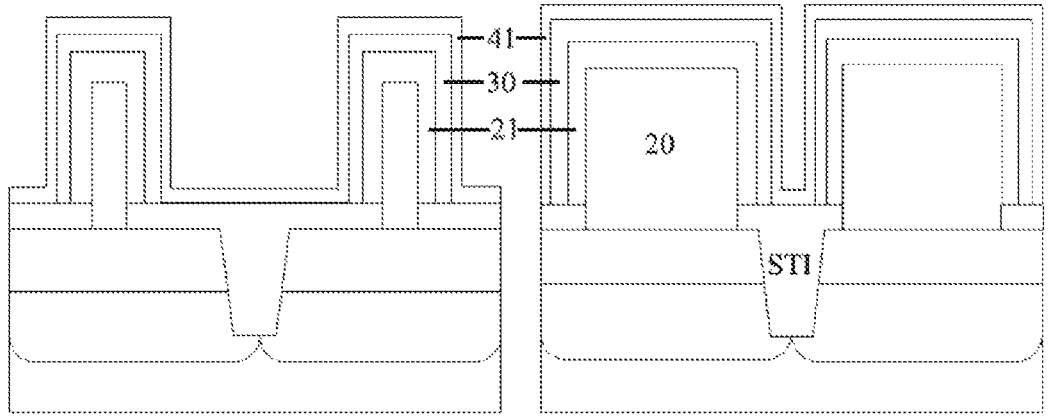
FIG. 7A and FIG. 7B are cross-sectional views showing an intermediate structure in the process of forming the QW-FinFET according to an embodiment of this invention.

Referring to FIG. 7A and FIG. 7B, a gate insulating material film 49 is formed on the barrier layers 30. The gate insulating material film 49 may be formed through MOCVD, ALD, Plasma Enhanced Chemical Vapor Deposition (PECVD), or an alternative process, and may be formed of a high-k dielectric material. Examples of suitable high-k dielectric materials may include $Al_2O_3$, $TiSiO_x$, etc. The thickness of the gate insulating material film 49 may be in a range of about 1 to 5 nm. The gate insulating material film 49 may sufficiently cover the fin structures 20, 21, and 30 and may cover the surface of the protection layer 12.

Subsequently, referring to FIG. 8A and FIG. 8B, a gate material layer (not shown) is formed on the gate insulating material film 49 and a patterning process is performed to form gates 40 and gate insulating layers 41. The gate material layer may be a metal gate material layer formed using NiAu, CrAu, and may be formed through PVD, MOCVD, ALD, MBE, or an alternative process to sufficiently cover the surface of the fins. The patterning process may comprise photoetching, etching, or an alternative process that is well known in the art. The gate material layer and the gate insulating material film 49 may be etched in a same etching step and/or may be etched in several etching steps.

Figures 8A, 8B:
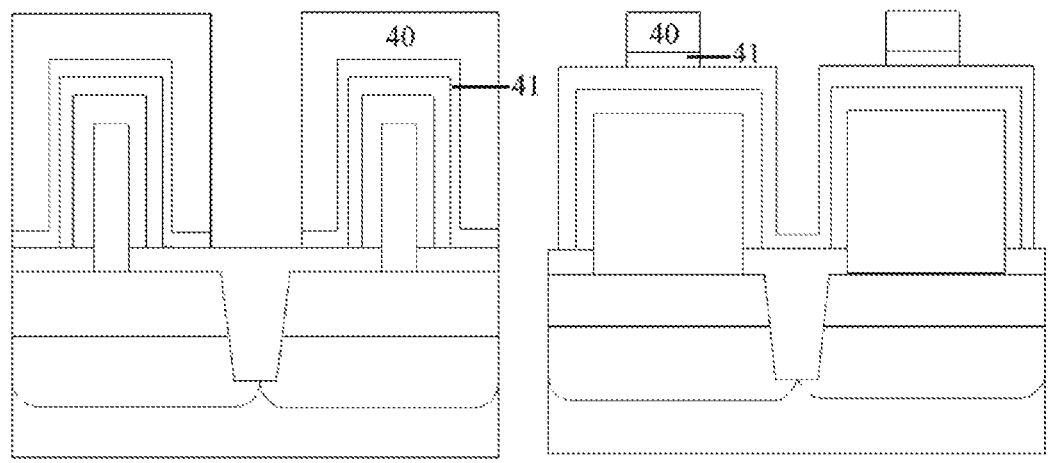
FIG. 8A and FIG. 8B are cross-sectional views showing an intermediate structure in the process of forming the QW-FinFET according to an embodiment of this invention.

As shown in FIG. 8A and FIG. 8B, a gate 40 and a gate insulating layer 41 may be formed on the middle portion of the corresponding fin and may cover three side surfaces of the fin.

Figures 9A, 9B:
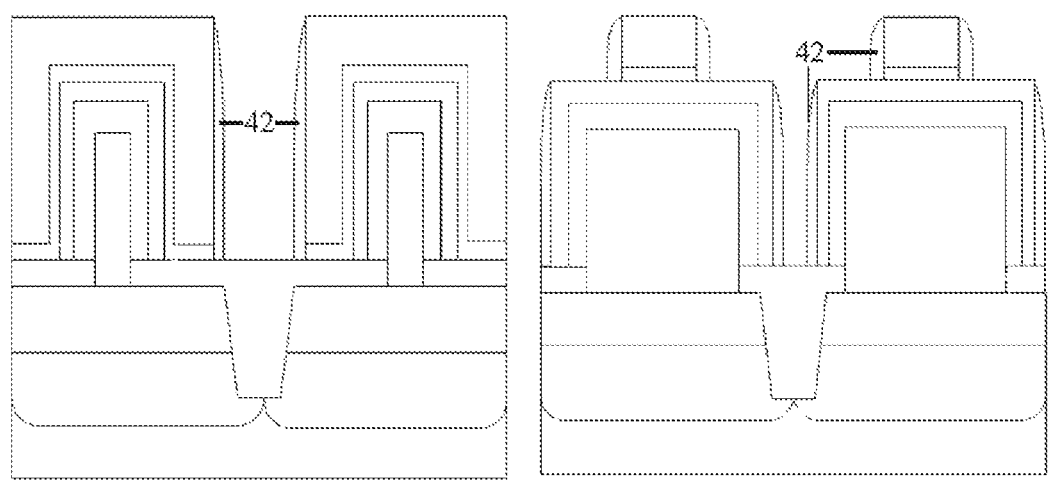
FIG. 9A and FIG. 9B are cross-sectional views showing an intermediate structure in the process of forming the QW-FinFET according to an embodiment of this invention.

Subsequently, as shown in FIG. 9A and FIG. 9B, sidewall spacers 42 may be formed on sidewalls of the gates 40 and the gate insulating layers 41. The sidewall spacers 42 may be formed of an inorganic insulating material, such as $SiO_2$. For example, a $SiO_2$ film may be formed conformably through an isotropic deposition process, and a top portion of the $SiO_2$ film may be removed through a directional etching process, such that the $SiO_2$ spacers may remain on sidewalls of the gates 40, the gate insulating layers 41, and the fin structures.

Subsequently, referring to FIG. 10A and FIG. 10B, a directional etching process, for example, inductively coupled plasma (ICP) dry etching, is performed using the gates 40 and the gate spacers 42 as masks, to remove parts of the barrier layers 30 and the fin layers 21 until the top surfaces of the fin bars 20 are exposed. Subsequently, referring to FIG. 11A and FIG. 11B, an isotropic etching process is performed to remove remaining portions of the barrier layers 30 and the fin layers 21 from sidewalls of the fin bars 20. The isotropic etching process may be wet etching, for example, a non-selective etching solvent $H_3PO_4$: $H_2O_2$: $H_2O$. Thus, portions of the fin bars 20 that are not covered by the gates 40 may be exposed, and side surfaces of the fin layers 21 may be exposed.

Referring to FIG. 11B, when the isotropic etching is performed, undercut may occur in regions directly under the gates 40 and/or the gate spacers 42, so that the widths of the InP barrier layers 30 and the fin layers 21 may be reduced, and step portions may be formed in the fin bars 20. It should be understood that the lengths of the channels may be substantially determined by the undercut. The lengths of the channels may be controlled through controlling the widths of the gates 40 and the gate spacers 42 and/or controlling the undercut.

Subsequently, referring to FIG. 12A and FIG. 12B, sources and drains 50 may be formed. For example, an InGaAs epitaxial layer may be formed through MOCVD, MBE, or an alternative process, such that the InGaAs layer may directly contact the fin bars 21, i.e., Ge quantum well layers, and the fin layer 21, i.e., InGaAs quantum well layers. Subsequently, a doping process may be performed for each of the p-type FET 100 and the n-type FET 200. For example, p-type impurity doping may be performed on the source and the drain 50 of the p-type FET 100 while the n-type FET 200 is masked, wherein a p-type impurity, such as Mg or Zn, may be employed, and the doping concentration may be, for example, $10^{19}$ to $10^{20}$ $cm^{-3}$; subsequently, n-type impurity doping is performed on the source and the drain 50 of the n-type FET 200, wherein a n-type impurity such as Si may be employed, and the doping concentration may be, for example, $10^{19}$ to $10^{20}$ $cm^{-3}$. It should be understood that the order of the processes is not limited to this. In an embodiment of this invention, one of the p-type FET 100 and the -type FET 200 may be masked to directly perform epitaxial growth of a doped source/drain for the other one.

In one or more embodiments, sources and drains may be formed in one or more of the structures described above with reference to FIGS. 10A, 10B, 11A, 11B, 12A, and 12B. Sources and drains may be formed through sequentially performing dry etching, wet etching, and epitaxial growth to accurately control the length of the channel. Those skilled in the art may appreciate that sources and drains may be formed in many other ways. In an embodiment, dry etching may be performed on the structure shown in FIGS. 9A and 9B, and sources and drains may be directly grown epitaxial. In an embodiment, sources and drains may be formed through directly performing an ion implantation doping process using the gates 40 and the gate sidewall spacers 42 shown in FIGS. 9A and 9B as masks.

Source electrodes and drain electrodes (not shown) may be formed on the sources and drains 50. The source electrodes and the drain electrodes may be formed of TiAu or NiAu, for example. Thus, a p-type FET 100 and an n-type FET 200 according to an embodiment of this invention may be formed.

Referring to FIGS. 12A, 12B, 2B, and 2C, when the gate 40 of the p-type FET 100 is negative biased, a two-dimensional hole gas may be formed on the Ge side of the InGaAs/Ge heterojunction, as represented by the dashed line A; when the gate 40 of the n-type FET 200 is positive biased, a two-dimensional electron gas may be formed on the InGaAs side of the InP/InGaAs heterojunction, as represented by the dashed line B.

The invention has been described with reference to specific illustrative embodiments of the invention. It will be apparent that various changes and modifications can be made to these embodiments without departing from the spirit and the scope as set forth in the claims. The scope of the invention is defined by the accompanying claims and the equivalents thereof.

What is claimed is:

1. A transistor device comprising:
a substrate having a first first-type well portion;
a buffer layer having a second first-type well portion, wherein an intrinsic semiconductor material of the buffer layer is different from an intrinsic semiconductor material of the substrate, wherein the first first-type well portion is a first p-well portion, and wherein the second first-type well portion is a second p-well portion;
a first source member;
a first drain member;
a first fin bar formed of a first semiconductor material, disposed between the first source member and the first drain member, and overlapping the first first-type well portion, wherein a semiconductor material of the first first-type well portion is different from the first semiconductor material, and wherein the second first-type well portion is positioned between the first fin bar and the first first-type well portion in a direction perpendicular to a surface of the substrate; and
a first fin layer formed of a second semiconductor material, disposed between the first source member and the first drain member, and contacting the first fin bar.

2. The transistor device of claim 1, further comprising:
a second source member;
a second drain member;
a second fin bar formed of the first semiconductor material, disposed between the second source member and the second drain member, and overlapping a second-type well portion of the substrate; and
a second fin layer formed of the second semiconductor material, disposed between the second source member and the second drain member, and contacting the second fin bar.

3. A transistor device comprising:
a substrate having a first-type well portion;
a doped first source member;
a first drain member;
a first fin bar formed of a first semiconductor material, disposed between the doped first source member and the first drain member in a direction parallel to a surface of the substrate, and overlapping the first-type well portion;
a first fin layer formed of a second semiconductor material, disposed between the doped first source member and the first drain member, and directly contacting the first fin bar, wherein the doped first source member directly contacts both the first fin bar and the first fin layer; and
a buffer layer disposed between the first fin bar and the substrate in a direction perpendicular to the surface of the substrate,
wherein the buffer layer is formed by SiGe, GaAs, or AlGaAs, and
wherein the semiconductor substrate includes a Si(111) portion.

4. The transistor device of claim 1, wherein the first fin layer directly contacts three side surfaces of the first fin bar, and wherein a bandgap of the first semiconductor material is narrower than a bandgap of the second semiconductor material.

5. The transistor device of claim 1,
wherein the first semiconductor material is a p-type semiconductor material, and
wherein the second semiconductor material is an n-type material.

6. The transistor device of claim 1, further comprising: a first barrier layer formed of a third semiconductor material and contacting the first fin layer.

7. The transistor device of claim 6, wherein a bangap of the third semiconductor material is broader than a bandgap of the second semiconductor material.

8. The transistor device of claim 6, wherein the third semiconductor material is an n-type material.

9. The transistor device of claim 1, further comprising: a first gate overlapping a first portion of the first fin bar without overlapping a second portion of the first fin bar in a direction perpendicular to the surface of the substrate, wherein a thickness of the first portion of the first fin bar in the direction is unequal to a thickness of the second portion of the first fin bar in the direction.

10. The transistor device of claim 1, wherein the buffer layer is disposed between the first fin bar and the substrate in the direction perpendicular to the surface of the substrate,
wherein the buffer layer is formed by SiGe, GaAs, or AlGaAs, and
wherein the semiconductor substrate includes a Si(111) portion.

11. A method for fabricating a transistor device, the method comprising:
forming a buffer layer on a substrate, wherein the substrate comprises a first-type well portion and an undoped portion, and wherein the first-type well portion is positioned between the undoped portion and the buffer layer in a direction perpendicular to the substrate;
forming a first fin bar using a first semiconductor material such that the first fin bar overlaps the first-type well portion of the substrate, wherein a semiconductor material of the first-type well portion is different from the first semiconductor material, and wherein the buffer layer is positioned between the first-type well portion and the first fin bar in the direction perpendicular to the substrate;
forming a first fin layer using a second semiconductor material such that the first fin layer contacts the first fin bar;
forming a first source member such that the first source member contacts a first side of the first fin bar and a first side of the first fin layer; and
forming a first drain member such that the first drain member contacts a second side of the first fin bar and a second side of the first fin layer.

12. The method of claim 11, further comprising:
forming a second fin bar using the first semiconductor material such that the second fin bar overlaps a second-type well portion of a substrate, wherein the first fin bar and the second fin bar are formed substantially simultaneously;
forming a second fin layer using a second semiconductor material such that the second fin layer contacts the second fin bar, wherein the first fin layer and the second fin layer are formed substantially simultaneously;

forming a second source member such that the second source member contacts a first side of the second fin bar and a first side of the second fin layer; and forming a second drain member such that the second drain member contacts a second side of the second fin bar and a second side of the second fin layer.

13. The method of claim 11, wherein a bandgap of the first semiconductor material is narrower than a bandgap of the second semiconductor material, wherein the first semiconductor material is a p-type semiconductor material, and wherein the second semiconductor material is an n-type material.

14. The method of claim 11, wherein the forming the first source member comprises:

performing etching to expose an exposed portion of the first side of the first fin bar and an exposed portion of the first side of the first fin layer; and growing the first source member to contact the exposed portion of the first side of the first fin bar and the exposed portion of the first side of the first fin layer.

15. The method of claim 11, further comprising:

forming a first gate that overlaps a first semiconductor material layer and a second semiconductor material layer;

using the first gate as a mask in performing directional etching on the first semiconductor material layer and the second semiconductor material layer to form a first semiconductor layer and a second semiconductor layer; and performing isotropic etching on the first semiconductor layer and the second semiconductor layer for forming the first fin bar and the first fin layer.

16. The method of claim 15, further comprising: forming a sidewall spacer that contacts a side of the gate, wherein the isotropic etching removes a portion of the first semiconductor layer that is positioned between the sidewall spacer and the substrate.

17. The method of claim 11, wherein the first source member and the first drain member are formed of InGaAs.

18. The method of claim 11, further comprising: forming a first barrier layer using a third semiconductor material such that the first barrier layer contacts the first fin layer, wherein a bangap of the third semiconductor material is broader than a bandgap of the second semiconductor material.

19. The method of claim 18, wherein the first barrier layer includes an n-type InP layer.

20. The method of claim 11, wherein the first fin bar is formed on the buffer layer, wherein the buffer layer is formed of SiGe, GaAs, or AlGaAs, and wherein the substrate includes a Si(111) portion.

* * * * *